United States Patent [19]
Miura et al.

[11] Patent Number: 5,843,590
[45] Date of Patent: Dec. 1, 1998

[54] EPITAXIAL WAFER AND METHOD OF PREPARING THE SAME

[75] Inventors: Yoshiki Miura; Keiichiro Fujita; Kikurou Takemoto; Masato Matsushima; Hideki Matsubara; Shigenori Takagishi, all of Hyogo; Hisashi Seki; Akinori Koukitu, both of Tokyo, all of Japan

[73] Assignee: Sumitomo Electric Industries, Ltd., Osaka, Japan

[21] Appl. No.: 574,628

[22] Filed: Dec. 19, 1995

[30] Foreign Application Priority Data

Dec. 26, 1994 [JP] Japan .................................. 6-337797
Mar. 27, 1995 [JP] Japan .................................. 7-068048

[51] Int. Cl.$^6$ .................................................. B32B 18/00
[52] U.S. Cl. ........................... 428/698; 428/699; 428/700
[58] Field of Search .................... 428/336, 698, 428/700, 699; 117/952

[56] References Cited

U.S. PATENT DOCUMENTS

| | | | |
|---|---|---|---|
| 4,605,600 | 8/1986 | Niigaki ..................... | 428/700 |
| 5,306,662 | 4/1994 | Nakamura et al. ..................... | 437/107 |
| 5,334,277 | 8/1994 | Nakamura ..................... | 117/102 |
| 5,389,571 | 2/1995 | Takeuchi et al. ..................... | 437/133 |
| 5,408,120 | 4/1995 | Manabe et al. ..................... | 257/431 |
| 5,433,169 | 7/1995 | Nakamura ..................... | 117/102 |
| 5,587,014 | 12/1996 | Iyechika ..................... | 117/952 |

FOREIGN PATENT DOCUMENTS 0599224  6/1994  European Pat. Off. .

OTHER PUBLICATIONS

Nikkei Science, Oct. 1994, pp. 44–55.
Kentaro Onabe "Study on Mechanism of Cubic Structural Transformation Heteroepitaxy of Nitride Compound Semiconductors" Nihon Kessho Seicho Gakkai–Shi, vol. 21 Supplement S409–S414.
Harutoshi Tsuchiya et al, "Homoepitaxial Growth of Cubic GaN by Hydride Vapor Phase Epitaxy on Cubic GaN/GaAs Substrates Prepared with Gas Source Molecular Beam Epitaxy", Jpn. J. Appl. Phys. vol. 33 (1994) pp. 1747–1752.

*Primary Examiner*—Timothy Speer
*Attorney, Agent, or Firm*—W. G. Fasse; W. F. Fasse

[57] ABSTRACT

A high performance epitaxial wafer which is useful, for example in a light emitting device is produced with a buffer layer. The epitaxial wafer has a substrate of a compound semiconductor selected from a group consisting of GaAs, GaP, InAs and InP. The buffer layer of GaN is grown on the substrate to a thickness within the range of 10 nm to 80 nm. An epitaxial layer of GaN is formed on the buffer layer. The buffer layer is grown at a first temperature by organic metal chloride vapor phase epitaxy, while the epitaxial layer is grown at a second temperature, which is higher than the first temperature, by the organic metal chloride vapor phase epitaxy.

2 Claims, 9 Drawing Sheets

EPITAXIAL WAFER AND METHOD OF PREPARING THE SAME

FIELD OF THE INVENTION

The present invention relates to an epitaxial wafer and a method of preparing the same, and more particularly, it relates to an epitaxial wafer which is employed for a blue light emitting device, various ultraviolet region devices or a three primary color light emitting device, and a method of preparing the same.

BACKGROUND INFORMATION

First, the background art of an epitaxial wafer which is employed for a blue light emitting device is described.

Figure 10:
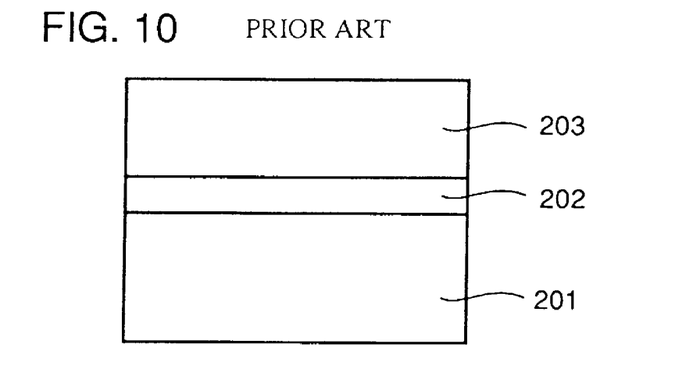
FIG. 10 is a sectional view showing the structure of an exemplary conventional epitaxial wafer.

FIG. 10 is a sectional view showing the structure of an epitaxial wafer, described in Nikkei Science, October 1994, p. 44, for example, which is applied to a GaN light emitting device (LED) employing a sapphire substrate, which is now coming onto the market.

Referring to FIG. 10, an epitaxial wafer is formed by a sapphire substrate 201, a gallium nitride (GaN) buffer layer 202 which is formed on the substrate 201, and a hexagonal n-type GaN epitaxial layer 203 which is formed on the GaN buffer layer 202. In this epitaxial wafer, the GaN buffer layer 202 is adapted to relax a distortion which is caused by a difference between the lattice constant of the sapphire substrate 201 and of the GaN epitaxial layer 203.

Figure 11:
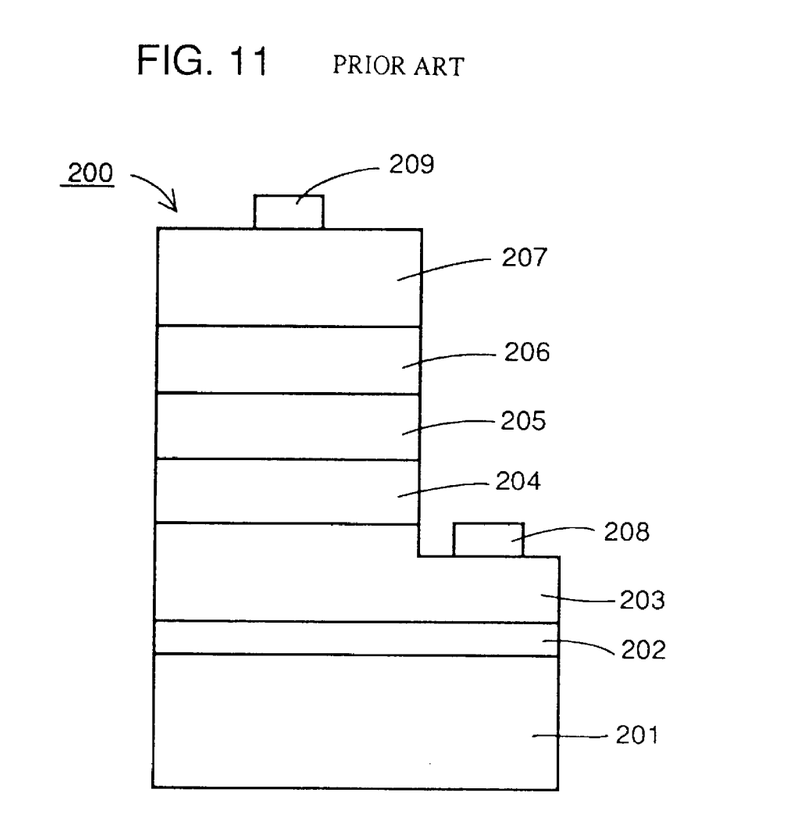
FIG. 11 is a sectional view showing the structure of a blue light emitting device employing the epitaxial wafer shown in FIG. 10.

FIG. 11 is a sectional view showing a GaN blue light emitting device 200 employing the epitaxial wafer shown in FIG. 10.

Referring to FIG. 11, a clad layer 204 consisting of n-type AlGaN, a blue light emitting layer 205, consisting of n-type $In_{0.1}Ga_{0.9}N$ which is doped with Zn, another clad layer 206 consisting of p-type AlGaN and a p-type GaN epitaxial layer 207 are successively formed on the epitaxial wafer layer shown in FIG. 10 of this blue light emitting device 200. Ohmic electrodes 208 and 209 are formed on the GaN epitaxial layers 203 and 207, respectively.

Referring to FIGS. 10 and 11, the substrate 201 of the epitaxial wafer is made of insulating sapphire. In order to prepare a device by forming the electrodes, therefore, patterning by photolithography is required at least twice while it is also necessary to etch the nitride layers by reactive ion etching, and hence complicated production steps are required. Further, sapphire is disadvantageously hard to treat, due to its hardness. In view of application to a light emitting device, in addition, the epitaxial wafer cannot be applied to a laser diode having an optical resonator of a cleavage end plane since the sapphire substrate cannot be cloven or split.

To this end, an attempt has been made to use conductive GaAs as a substrate in place of sapphire having the aforementioned disadvantages. When the material for the substrate is changed to GaAs, however, it is impossible to obtain an epitaxial wafer which compares with that employing a sapphire substrate under conditions similar to those for the sapphire substrate.

Thus, various studies have been made in relation to the preparation of an epitaxial wafer with a GaAs substrate.

Among these, Nihon Kessho Seicho Gakkai-Shi Vol. 21, No. 5 (1994), Supplement S409 to S414 (hereinafter referred to as "literature 1"), for example, discloses an epitaxial wafer shown in FIG. 12.

Figure 12:
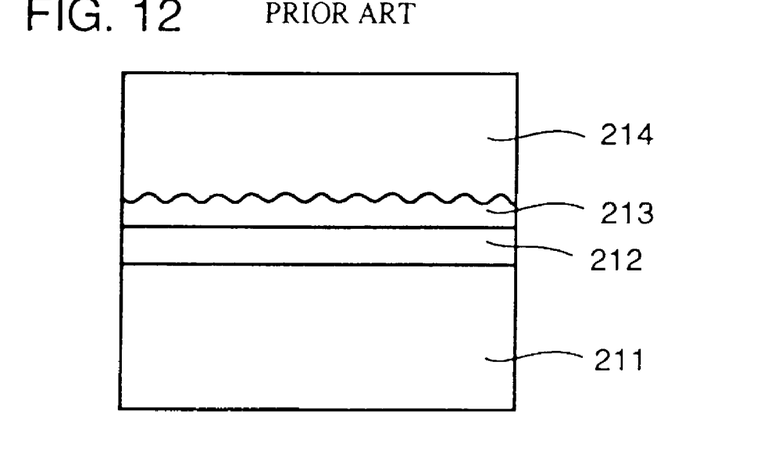
FIG. 12 is a sectional view showing the structure of another exemplary conventional epitaxial wafer.

Referring to FIG. 12, the epitaxial wafer comprises a GaAs substrate 211, a GaAs buffer layer 212 which is formed on this substrate 211, a GaN coating 213 which is obtained by nitriding the surface of the GaAs buffer layer 212 thereby replacing arsenic (As) with nitrogen (N), and a GaN epitaxial layer 214 which is formed on this GaN coating 213.

In preparation of this epitaxial wafer, the GaN epitaxial layer 214 is formed by OMVPE (organic metal vapor phase epitaxy). This OMVPE is adapted to introduce a first gas containing trimethyl gallium (TMGa) and a second gas containing ammonia ($NH_3$) into a reaction chamber while heating only a substrate in the reaction chamber by high frequency heating, thereby vapor depositing a GaN epitaxial layer on the substrate.

On the other hand, Jpn. J. Appl. Phys. Vol. 33 (1994), pp. 1747 to 1752 (hereinafter referred to as "literature 2"), for example, discloses an epitaxial layer shown in FIG. 13.

Figure 13:
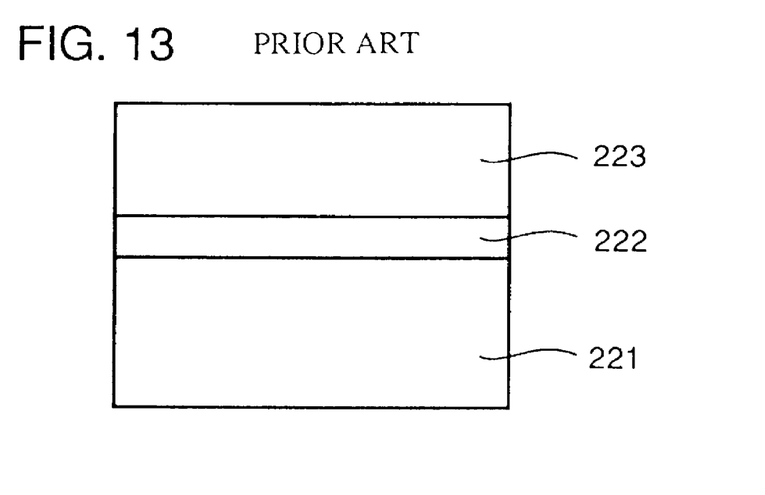
FIG. 13 is a sectional view showing the structure of still another exemplary conventional epitaxial wafer.

Referring to FIG. 13, the epitaxial layer comprises a substrate 221 which has been provided on its surface with a cubic GaN buffer layer 222 by GS-MBE (gas source molecular beam epitaxy) and a cubic GaN epitaxial layer 223 which is formed thereon.

In preparation of the epitaxial wafer, the GaN epitaxial layer 223 is formed by hydride VPE (vapor phase epitaxy). This hydride VPE is adapted for setting a substrate and a source boat containing a Ga metal in a reaction chamber and introducing a first gas containing hydrogen chloride (HCl) and a second gas containing ammonia ($NH_3$) into the reaction chamber while heating the entire chamber with a resistance heater from the exterior thereby vapor-depositing a GaN epitaxial layer on the substrate.

In the epitaxial layer disclosed in literature 1, however, the GaN epitaxial layer is grown by OMVPE, as described above. When a GaN epitaxial layer is grown on a GaAs substrate by this OMVPE, the film growth rate is extremely reduced as compared with the case of growing such a layer on a sapphire substrate. More specifically, the film forming rate is reduced to about 0.15 $\mu$m/hr., although a film forming rate of about 3 $\mu$m/hr. is attained on a sapphire substrate under the same conditions. In order to use the epitaxial wafer in a light emitting device, for example, it is necessary to form a GaN epitaxial layer of about 4 $\mu$m in thickness. Thus, with the just described method, it takes almost one day for preparing the epitaxial layer. Thus, preparation of the epitaxial wafer according to the above method is unsuitable for industrialization since the cost cannot be reduced.

According to the above method, further, the treatment temperature cannot be much increased during growth of the GaN epitaxial layer. Therefore, the improvement in the characteristic of the obtained GaN epitaxial layer is limited.

In the epitaxial wafer disclosed in literature 2, on the other hand, it is necessary to first prepare a substrate which is provided on its surface with a GaN buffer layer by GS-MBE, in order to form a GaN epitaxial layer. However, such formation of the GaN buffer layer on the GaAs substrate by GS-MBE is unsuitable for industrialization due to a slow growth rate.

Further, it is difficult to attain heterogrowth requiring a plurality of sources or multilayer growth due to using of hydride VPE. Thus, the "literature 2" method is unsuitable for practical use. In order to prepare an epitaxial wafer by that method, further, two reaction chambers are necessary due to a difference between the growth methods of the buffer and epitaxial layers. Moreover, surface contamination caused by interruption of growth may also come into question.

In literature 2, the preparation conditions for obtaining a GaN epitaxial layer of high quality characteristics have not been studied in particular.

The background of an epitaxial wafer which is employed for a three primary color light emitting device will now described.

Figure 14:
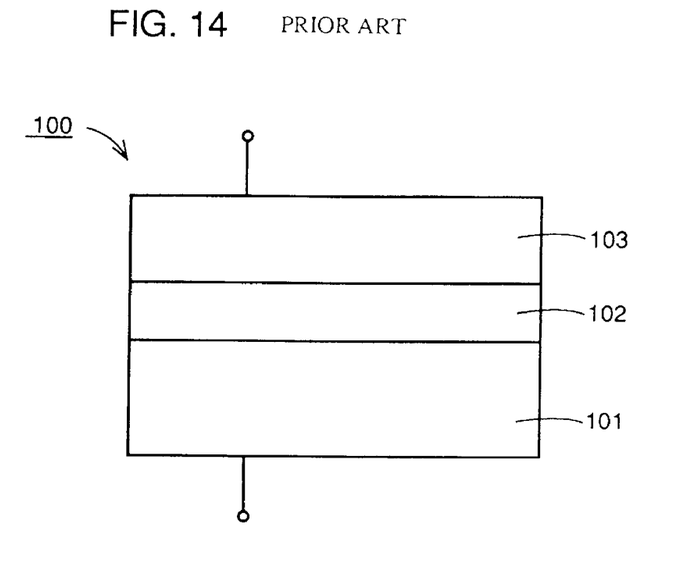
FIG. 14 is a sectional view showing the structure of a red light emitting device.

FIG. 14 is a sectional view showing an exemplary structure of a conventional AlGaAs red light emitting device (LED) 100.

Referring to FIG. 14, this red light emitting device 100 comprises a substrate 101, consisting of $Al_{0.5}Ga_{0.5}As$, which is doped with Zn, a red light emitting layer 102, consisting of p-type $Al_{0.35}Ga_{0.65}As$, which is formed on the substrate 101, and a is clad layer 103, consisting of n-type $Al_{0.6}Ga_{0.4}As$, which is formed on the red light emitting layer 102, and electrodes extend from the substrate 101 and from the clad layer 103.

The red light emitting device may alternatively be prepared from GaAsP materials, in place of the aforementioned AlGaAs materials.

Figure 15:
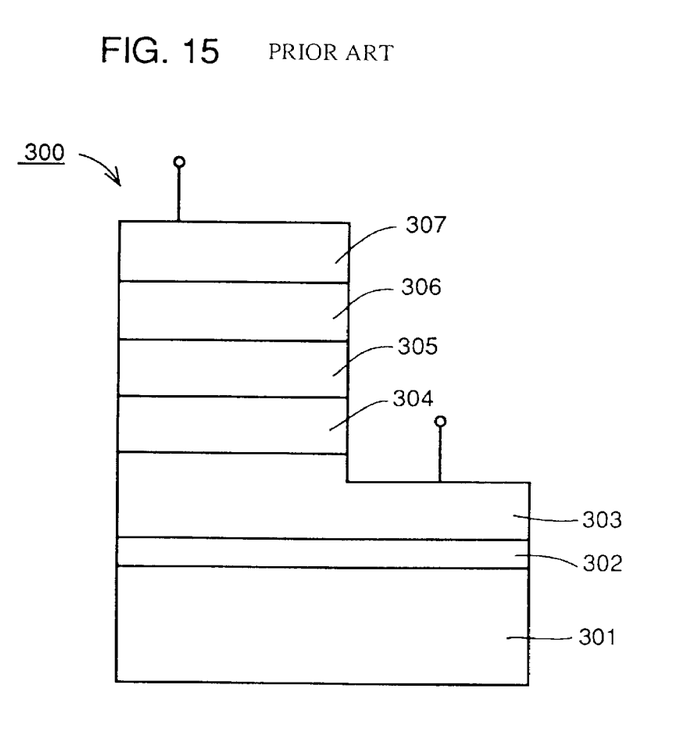
FIG. 15 is a sectional view showing the structure of a green light emitting device.

On the other hand, FIG. 15 is a sectional view showing an exemplary structure of a GaN green light emitting device (LED) 300, which is now coming onto the market similarly to a blue light emitting device.

Referring to FIG. 15, a clad layer 304 consisting of n-type AlGaN, a green light emitting layer 305, consisting of n-type $In_{0.2}Ga_{0.8}N$, which is doped with Zn, another clad layer 306 consisting of p-type AlGaN, and a p-type GaN epitaxial layer 307 are successively formed on an epitaxial layer formed by a sapphire substrate 301, a GaN buffer layer 302 which is formed on the substrate 301, and a cubic n-type GaN epitaxial layer 303 in this green light emitting device 300, and electrodes are taken from the GaN epitaxial layers 303 and 307.

In the above green light emitting device 300, the GaN buffer layer 302 is adapted to relax distortion which is caused by a difference between the lattice constant of the sapphire substrate 301 and the GaN epitaxial layer 303.

Although it has been generally possible to prepare red, blue and green light emitting devices (LED) independently of each other as described above, a hybrid device cannot be prepared. While GaN layers are grown on sapphire substrates in blue and green light emitting devices as hereinabove described, a technique of forming a GaN layer on an AlGaAs layer of a red light emitting element is required for forming a three primary color light emitting device of a multilayer structure.

In general, however, it has been impossible to form a GaN layer which is employed as the material for a blue light emitting device on an AlGaAs or GaAsP layer which is employed as the material for a red light emitting device. Therefore, LEDs of the respective colors must be set independently of each other in order to attain a multicolor display, and hence the pixel density cannot be improved.

SUMMARY OF THE INVENTION

In order to solve the aforementioned problems, an object of the present invention is to provide an epitaxial wafer of high performance which is applicable to a blue light emitting device or a three primary color light emitting device, for example, and a method capable of industrially preparing the same.

According to an aspect of the present invention, an epitaxial wafer is provided which comprises a substrate of a compound semiconductor selected from the group of consisting of GaAs, GaP, InAs, InP, AlGaAs and GaAsP, a buffer layer, consisting essentially of GaN, having a thickness in the range of 10 nm to 80 nm which is formed on the substrate, an epitaxial layer consisting essentially of GaN formed on the buffer layer, and an incommensurate surface positioned between the buffer layer and the epitaxial layer to form an interface therebetween. The term "consisting essentially of" as used herein allows for unavoidable or naturally occurring impurities.

The incommensurate surface forming an interface between the buffer layer and the epitaxial layer may be caused by deviation of crystal lattices resulting from the difference between the growth temperatures of the buffer layer and the epitaxial layer, for example. This incommensurate surface can be observed as a difference in contrast between the buffer layer and the epitaxial layer, through sectional observation of the device with a transmission electron microscope.

Preferably, the thickness of the buffer layer is in the range of 20 nm to 60 nm.

The buffer layer consisting of GaN, which is formed in the conventional epitaxial wafer employing a sapphire substrate, is mainly adapted to relax a distortion caused by a difference between the lattice constant of the sapphire substrate and the lattice constant of the GaN epitaxial layer. On the other hand, the buffer layer provided in the present invention also serves as a heat-resistant coating, in addition to the function of relaxing a distortion.

While epitaxy of GaN must be performed at a temperature of 800° C. to 1100° C. in general, GaN and a sapphire substrate are not thermally damaged at a temperature exceeding 800° C. In a substrate of GaAs, GaP, InAs or InP, however, As or P is lost at a temperature exceeding 800° C., to disable the substrate. In order to form a GaN epitaxial layer on a substrate of GaAs, GaP, InAs or InP, therefore, it is necessary to form a heat-resistant coating. According to the present invention, the GaN buffer layer which is formed at a lower temperature than that for the GaN epitaxial layer serves as such a heat-resistant coating.

The thickness of the GaN buffer layer is in the range of 10 nm to 80 nm. If the thickness is smaller than 10 nm, the buffer layer is partially interrupted during the temperature rise for forming the epitaxial layer, and the epitaxial layer formed thereon is disadvantageously separated. If the thickness exceeds 80 nm, on the other hand, nuclear growth is mixed into low-temperature growth of the flat buffer layer and the epitaxial layer is disadvantageously pyramidically grown along nuclei.

According to another aspect of the present invention, a method of preparing an epitaxial wafer comprises the steps of forming a buffer layer consisting essentially of GaN on a substrate of a compound semiconductor which is selected from the group of consisting of GaAs, GaP, InAs, InP, AlGaAs and GaAsP at a first temperature by introducing a first gas containing hydrogen chloride and organic metal raw material including gallium and a second gas containing ammonia into a reaction chamber while heating the entire reaction chamber from the exterior thereby vapor-depositing the buffer layer on the substrate which is set in the reaction chamber, and forming an epitaxial layer containing GaN on the buffer layer at a second temperature which is higher than the first temperature by introducing the first gas containing hydrogen chloride and the organic metal raw material including gallium and the second gas containing ammonia into the reation chamber while heating the entire reaction chamber from the exterior thereby vapor-depositing the epitaxial layer on the substrate which is set in the reaction chamber.

The organic metal raw material including gallium is prepared from trimethyl gallium or triethyl gallium, for example.

Preferably, the first temperature is within the range of 300° C. to 700° C., and the second temperature is at least 750° C.

More preferably, the first temperature is within the range of 400° C. to 600° C.

According to the present method of preparing an epitaxial wafer, the GaN buffer layer is formed on the substrate of a compound semiconductor selected from the group consisting of GaAs, GaP, InAs, InP, AlGaAs and GaAsP at a temperature which is lower than the growth temperature of the GaN epitaxial layer.

Therefore, it is possible to grow a cubic GaN epitaxial layer of high quality without damaging any substrate crystals.

The temperature for forming the buffer layer consisting essentially of GaN is preferably within the range of 300° C. to 700° C. If the temperature is lower than 300° C., no buffer layer consisting of GaN is grown. If the temperature is higher than 700° C., on the other hand, the substrate is thermally damaged so that the epitaxial layer formed thereon is disadvantageously separated.

According to the present invention, further, the GaN buffer layer and the GaN epitaxial layer are formed by the method (hereinafter referred to as "organic metal chloride vapor phase epitaxy") of introducing the first gas containing hydrogen chloride and the organic metal raw material including gallium and the second gas containing ammonia into the reaction chamber while heating the entire reaction chamber from the exterior thereby vapor-depositing the layers on the substrate which is set in the reaction chamber. This organic metal chloride vapor phase epitaxy takes place at a high growth rate and is capable of obtaining steep hetero-interfaces.

According to the present invention, further, the buffer layer and the epitaxial layer are formed by the same organic metal chloride vapor phase epitaxy. Thus, it is possible to consistently grow the layers in the same chamber.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Examples employing binary compound semiconductor substrates are now described.

EXAMPLE 1

Figure 1:
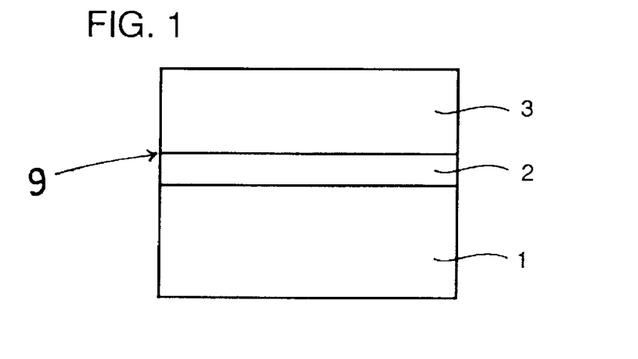
FIG. 1 is a sectional view showing the structure of an exemplary epitaxial wafer according to the present invention.

FIG. 1 is a sectional view showing the structure of an exemplary epitaxial wafer according to the present invention.

Referring to FIG. 1, a GaN buffer 2 is formed on a GaAs substrate 1, and a GaN epitaxial layer 3 is further formed thereon in this epitaxial wafer. An incommensurate surface 9 is positioned between the GaN buffer layer 2 and the GaN epitaxial layer 3 to form an interface therebetween.

A method of preparing the epitaxial wafer having the aforementioned structure will now described.

Figure 2:
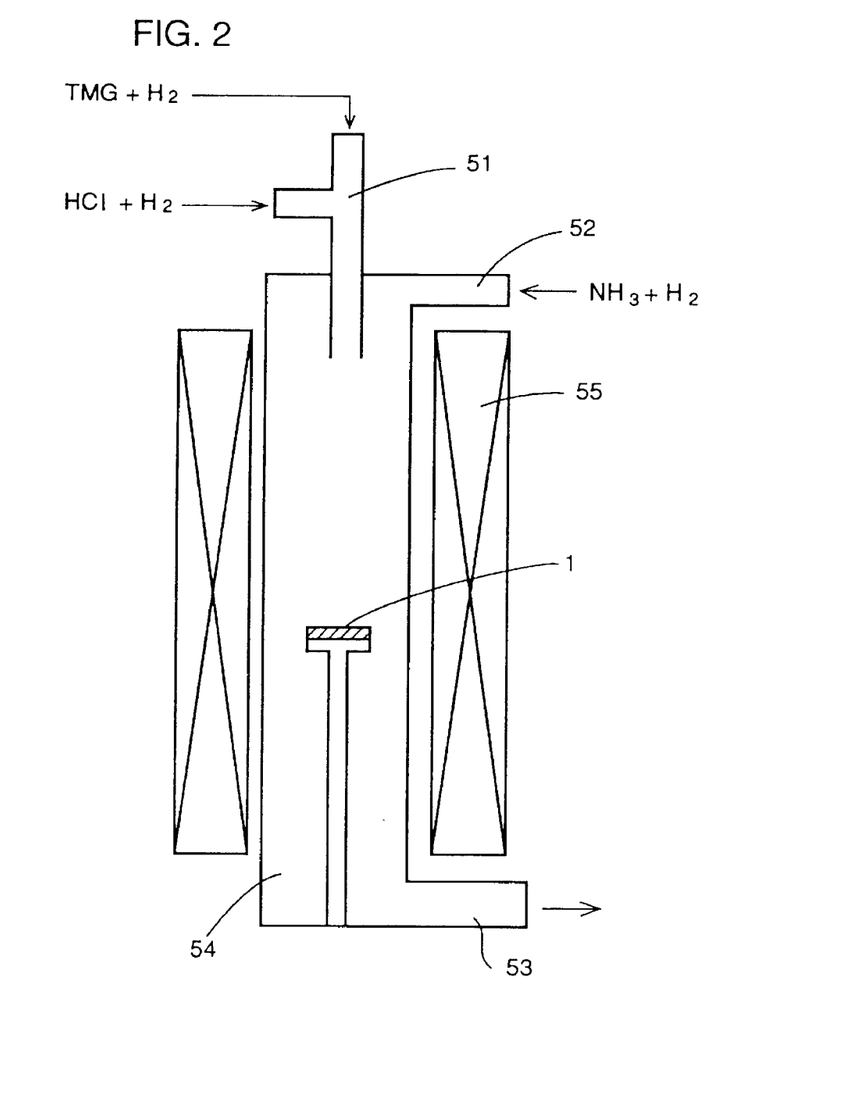
FIG. 2 schematically illustrates the structure of a vapor phase epitaxy apparatus which is employed for producing of an epitaxial wafer by an organic metal chloride vapor phase epitaxy according to the present invention.

FIG. 2 schematically illustrates the structure of a vapor phase epitaxy apparatus which is employed for preparing an epitaxial wafer through organic metal chloride vapor phase epitaxy according to the present invention. Referring to FIG. 2, this apparatus is formed by a reaction chamber 54 having first and second gas inlet ports 51 and 52, an exhaust port 53, and a resistance heater 55 for heating the entire reaction chamber 54 from the exterior.

Through the apparatus having the aforementioned structure, a sample of the epitaxial wafer was prepared as follows:

Referring to FIG. 2, a gallium arsenide (GaAs) (100) plane substrate 1 which was pretreated with an ordinary etching solution of $H_2SO_4$ was set in the reaction chamber 54 made of quartz.

Then, the entire reaction chamber 54 was heated by the resistance heater 55 from the exterior and maintained at 500° C. so that trimethyl gallium (TMGA) serving as group III raw material and hydrogen chloride (HCl) were introduced through the first gas inlet port 51 at partial pressures of $8 \times 10^{-4}$ atm. and $8 \times 10^{-4}$ atm. respectively while ammonia gas ($NH_3$) serving as group V raw material was introduced through the second gas inlet part 52 at a partial pressure of $1.6 \times 10^{-1}$ atm. Under such conditions, epitaxial growth progressed for 15 minutes, to form the GaN buffer layer 2 having a thickness of 30 nm.

Figure 3:
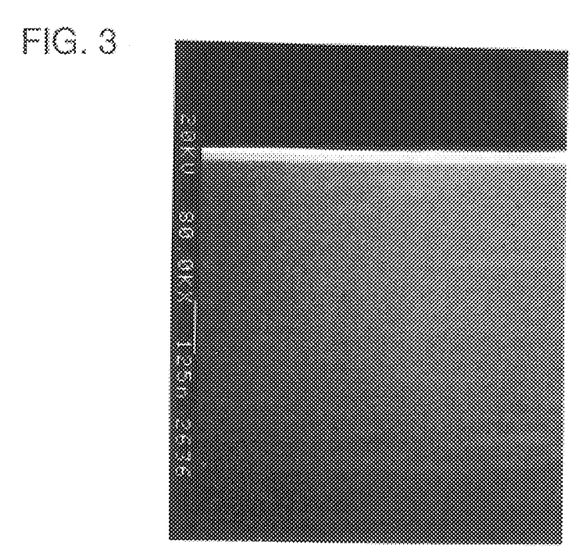
FIG. 3 shows an SEM (scanning electron microscope) photograph for observing the crystal structure of a GaN buffer layer formed on a substrate according to the present invention.

FIG. 3 is a photograph showing the crystal structure of the GaN buffer layer 2 formed in the aforementioned manner, wherein the photograph was taken with an SEM from a cleavage plane.

Referring to FIG. 3, it is understood that the GaN buffer layer 2 appearing white is formed extremely homogeneously on the substrate 1 with a thickness of about 30 nm.

Then, the temperature of the substrate 1 which was provided with the GaN buffer layer 2, was increased to 850° C. by the resistance heater 55, and an epitaxial growth progressed for 60 minutes with TMGA, HCl and $NH_3$ at partial pressures of $8 \times 10^{-4}$ atm., $8 \times 10^{-4}$ atm. and $1.6 \times 10^{-6}$ atm., respectively.

As the result, a mirror-surface type GaN epitaxial layer 3 having a thickness of 2 μm was formed on the GaN buffer layer 2. In a photoluminescence (PL) spectrum of this GaN epitaxial layer 3, strong light emission was observed with a peak wavelength of 360 nm. Further, growth of a cubic GaN epitaxial layer containing no hexagonal system was confirmed as the result of X-ray diffraction.

Figure 4:
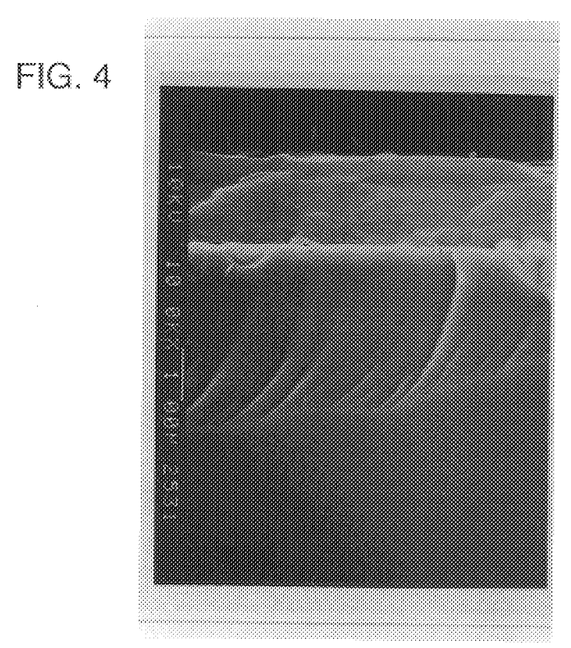
FIG. 4 shows an SEM photograph for observing the crystal structure of an exemplary epitaxial wafer according to the present invention.

FIG. 4 is a photograph showing the crystal structure of the GaN epitaxial layer which was formed in the aforementioned manner, wherein the photograph was taken with an SEM from a cleavage plane.

Refering to FIG. 4, it is noted that an extremely flat GaN epitaxial layer 3 is formed on the GaN buffer layer 2 which itself is formed on the GaAs substrate 1.

EXAMPLE 2

An epitaxial wafer having the structure shown in FIG. 1 was prepared under the same conditions as Example 1, except for the following growth conditions for the GaN buffer layer 2:

Growth Conditions for GaN Buffer Layer

Substrate Temperature: 450° C.

Partial Pressure of TMGa: $1 \times 10^{-4}$ atm.

Partial Pressure of HCl: $1 \times 10^{-4}$ atm.

Partial Pressure of $NH_3$: $5 \times 10^{-3}$ atm.

Growth Time: 60 minutes

In the epitaxial wafer obtained in the aforementioned manner, a GaN buffer layer 2 having a thickness of 30 nm was formed.

Further, a GaN epitaxial layer 3 which was grown on the buffer layer at 850° C. for 60 minutes, had an excellent flatness, with surface irregularity of about 10 μm.

EXAMPLE 3

An epitaxial wafer having the structure shown in FIG. 1 was prepared under the same conditions as Example 1, except for the following growth conditions for a GaN buffer layer 2 and a GaN epitaxial layer 3:

Growth Conditions for GaN Buffer Layer

Substrate Temperature: 400° C.

Partial Pressure of TMGa: $1 \times 10^{-4}$ atm.

Partial Pressure of HCl: $1 \times 10^{-4}$ atm.

Partial Pressure of NH3: $5 \times 10^{-3}$ atm.

Growth Time: 80 minutes

Growth Conditions for GaN Epitaxial LaVer

Substrate Temperature: 900° C.

Partial Pressure of TMGa: $3 \times 10^{-4}$ atm.

Partial Pressure of HCl: $3 \times 10^{-4}$ atm.

Partial Pressure of NH3: $8 \times 10^{-4}$ atm.

Growth Time: 60 minutes is In the epitaxial wafer obtained in the aforementioned manner, a mirror-surface type GaN epitaxial layer 3 was formed having a thickness of 8 μm on a GaN buffer layer 2 having a thickness of 20 nm.

In a PL spectrum of this GaN epitaxial layer 3, strong light emission was observed with a peak wavelength of 360 nm. Further, growth of a cubic GaN epitaxial layer containing no hexagonal system was confirmed as the result of X-ray diffraction. (Comparative Example 1)

In order to investigate differences caused in the characteristics of the GaN epitaxial layer due to the presence or absence of the GaN buffer, a GaN epitaxial layer was directly grown on a GaAs substrate, under growth conditions similar to those of Example 1.

Figure 5:
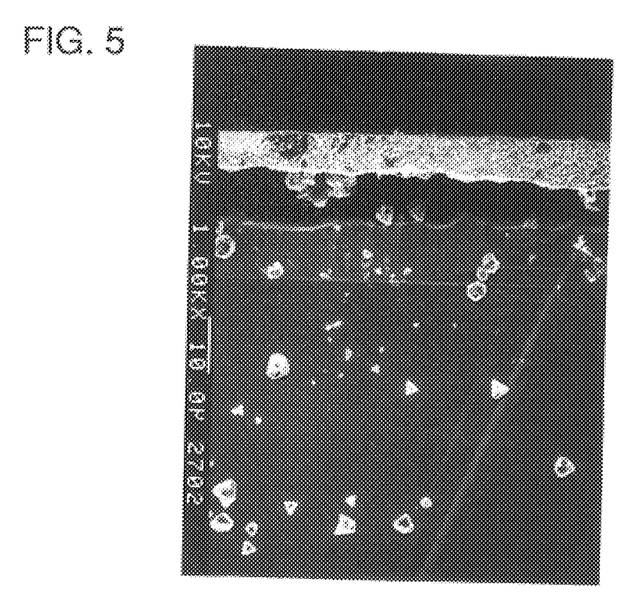
FIG. 5 shows an SEM photograph for observing the crystal structure of an exemplary epitaxial wafer prepared with no provision of a GaN buffer layer for comparison.

FIG. 5 is a photograph showing the crystal structure of the GaN epitaxial layer which was prepared in the aforementioned manner wherein the photograph was taken with an SEM from a cleavage plane.

Referring to FIG. 5, it will be noted that the GaAs substrate surface is damaged by the high temperature, and is so irregularized that the GaN epitaxial layer formed thereon is separated from the substrate.

In order to compare the difference in characteristics caused by the presence or absence of the buffer layer, surface irregularity levels were measured of the GaN epitaxial layers with a surface roughness meter, X-ray diffraction and PL measurements were compared with each other as to the epitaxial wafers obtained according to Example 1 and comparative example 1.

As a result of the comparing, of a remarkable difference was observed as to the surface irregularity levels of the GaN epitaxial layers, and it has been recognized that the surface homology is extremely improved due to the provision of the GaN buffer layer. Also as to the results of X-ray diffraction and PL measurements, extremely sharp peaks were observed only on Example 1 provided with the GaN buffer layer.

EXAMPLE 4

In order to study the optimum thickness of the GaN buffer layer, GaN buffer layers of various thicknesses were formed on GaAs substrates and GaN epitaxial layers were grown thereon for comparing the characteristics thereof with each other.

The GaN buffer layers and the GaN epitaxial layers were grown under conditions similar to those in Example 1.

Figure 6:
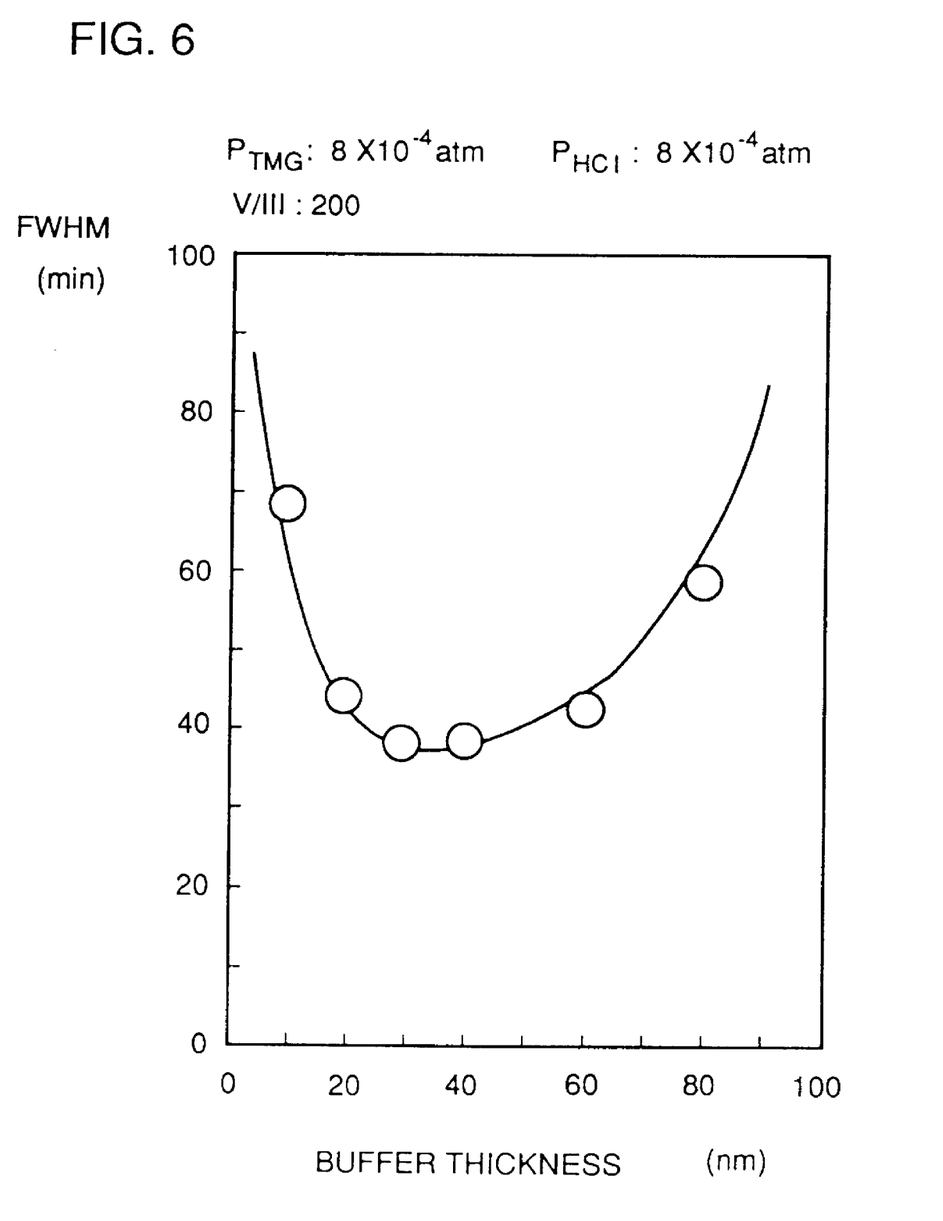
FIG. 6 illustrates relationships between thicknesses of GaN buffer layers and half-band widths (FWHM) of X-ray peaks of GaN epitaxial layers.

FIG. 6 illustrates the relationship between thicknesses of the GaN buffer layers and half-band widths (FWHM) of X-ray peaks of the GaN epitaxial layers. Referring to FIG. 6, the abscissa shows the thicknesses (nm) of the GaN buffer layers, and the ordinate shows the half-band widths (FWHM) (min.) of the X-ray peaks.

Figure 7:
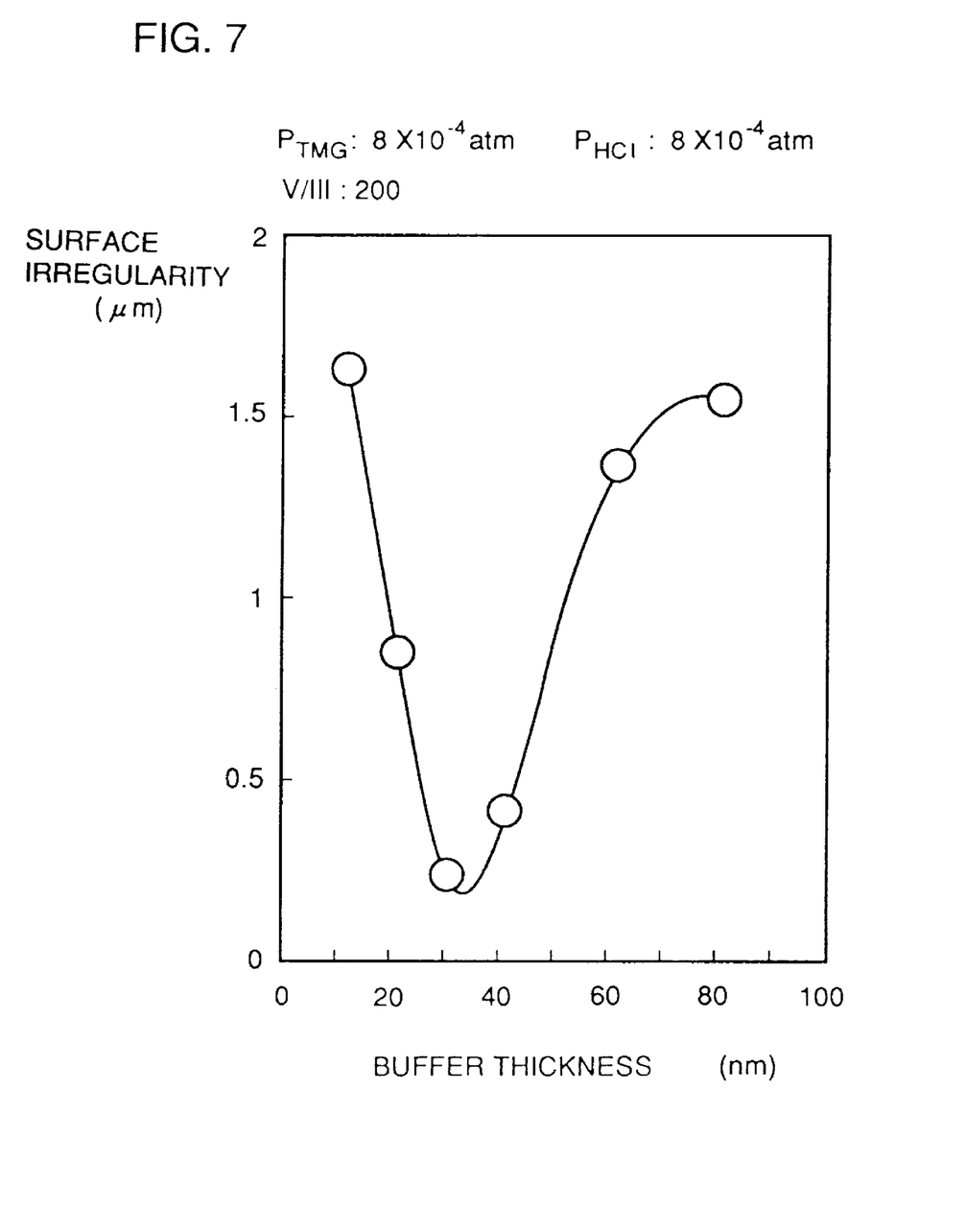
FIG. 7 illustrates relationships between thicknesses of GaN buffer layers and surface irregularity levels of GaN epitaxial layers.

FIG. 7 illustrates the relationship between the thicknesses of the GaN buffer layers and the surface irregularity levels of the GaN epitaxial layers. Referring to FIG. 7, the abscissa shows the thicknesses (nm) of the GaN buffer layers, and the ordinate shows the surface irregularity levels (μm). The surface irregularity levels are differences between uppermost points of convex portions and lowermost points of concave portions.

As clearly understood from FIGS. 6 and 7, the crystallinity of a GaN epitaxial layer which is grown on a buffer layer is reduced if the thickness of the buffer layer is too large or too small. Thus, it is understood that the thickness of the GaN buffer layer is preferably within the range of 10 nm to 80 nm, and more preferably within the range of 20 nm to 60 nm.

Figure 8:
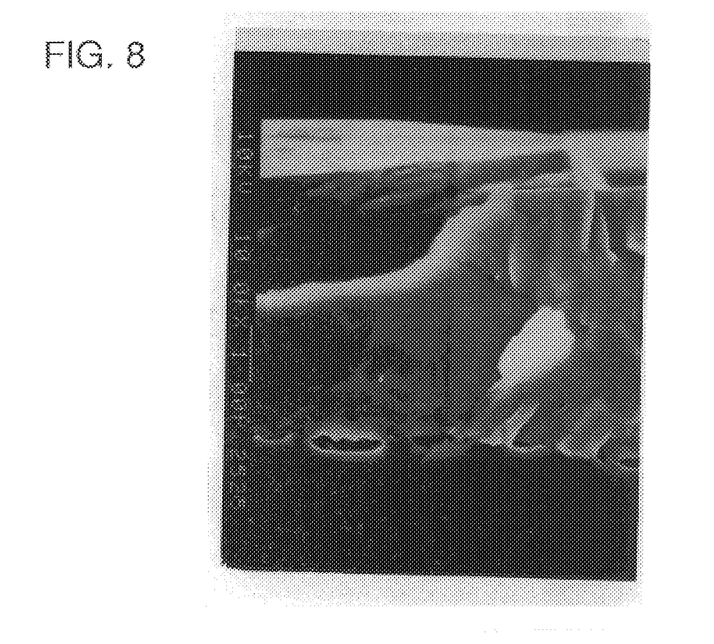
FIG. 8 shows an SEM photograph for observing the crystal structure of an exemplary epitaxial wafer prepared with a GaN buffer layer having a thickness of 8 nm for comparison.

FIG. 8 is a photograph showing the crystal structure of a GaN epitaxial layer formed on a GaN buffer layer having a thickness of 8 nm, wherein the photograph was taken with an SEM from a cleavage plane.

Referring to FIG. 8, the GaN buffer layer which is too small in thickness, is partially interrupted when the substrate is heated from 500° C. to 850° C. for forming the GaN epitaxial layer such that a portion of the GaN epitaxial layer formed on the interrupted part is separated. As a result, the epitaxial wafer is disadvantageously partially perforated.

Figure 9:
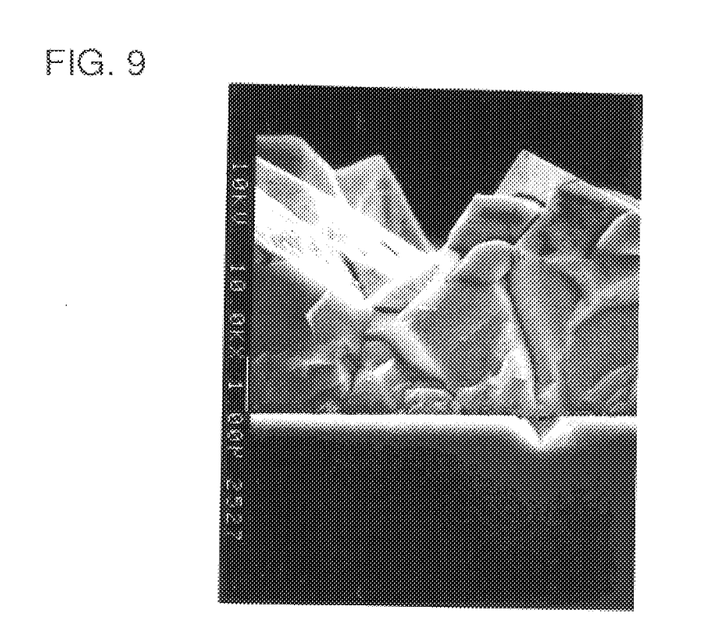
FIG. 9 shows an SEM photograph for observing the crystal structure of an exemplary epitaxial wafer prepared with employment of a GaN buffer layer having a thickness of 90 nm for comparison.

FIG. 9 is a photograph showing the crystal structure of a GaN epitaxial layer formed on a GaN buffer layer having a thickness of 90 nm, wherein the photograph was taken with an SEM from a cleavage plane.

Referring to FIG. 9, it is observed that nucleation is caused on the GaN buffer layer which is too large in thickness such that the GaN epitaxial layer is disadvantageously pyramidically grown about the nuclei.

EXAMPLE 5

A GaN buffer layer was formed under conditions similar to those of Example 1 except that a GaP substrate was employed in place of the GaAs substrate, and a GaN epitaxial layer was further formed thereon under conditions similar to those of Example 1.

In an epitaxial wafer obtained in the aforementioned manner, the GaN epitaxial layer was subjected to PL measurement and X-ray diffraction measurement. As a result, excellent peaks were obtained similarly to Example 1.

EXAMPLE 6

A GaN buffer layer was formed under conditions similar to those of Example 1 except that an InP substrate was employed in place of the GaAs substrate, and a GaN epitaxial layer was further formed thereon under conditions similar to those of Example 1.

In an epitaxial wafer obtained in the aforementioned manner, the GaN epitaxial layer was subjected to PL measurement and X-ray diffraction measurement. As a result, excellent peaks were obtained similarly to Example 1.

EXAMPLE 7

A GaN buffer layer was formed under conditions similar to those of Example 1 except that TEGA (triethyl gallium) was employed as the group III raw material in place of TMGA, and a GaN epitaxial layer was further formed thereon with TEGA, under conditions similar to those of Example 1.

In an epitaxial wafer obtained in the aforementioned manner, the GaN epitaxial layer was subjected to PL measurement and X-ray diffraction measurement. As the result, excellent peaks were obtained similarly to Example 1.

Examples employing ternary compound semiconductor substrates are now described.

EXAMPLE 8

Experiments were made similarly to Examples 1 to 4 and 7 and comparative example 1 with AlGaAs substrates in place of GaAs substrates, whereby results which were absolutely similar to those in the GaAs substrates were obtained.

EXAMPLE 9

A GaN buffer layer was formed under conditions similar to those of Example 1 except that a GaAsP substrate was employed in place of the GaAs substrate, and a GaN epitaxial layer was further formed thereon under conditions similar to those of Example 1.

In an epitaxial wafer obtained in the aforementioned manner, the GaN epitaxial layer was subjected to PL measurement and X-ray diffraction measurement. As the result, excellent peaks were obtained similarly to Example 1.

According to the present invention, as hereinabove described, an epitaxial wafer which is provided with a cubic GaN epitaxial layer of high quality can be obtained with a substrate of a binary compound semiconductor such as GaP, InAs or InP or a ternary compound semiconductor such as AlGaAs or GaAsP. Thus, the epitaxial wafer according to the present invention is applicable to a blue light emitting device, various ultraviolet region devices, or a three primary color light emitting device.

According to the present invention, further, the epitaxial wafer can be prepared at a high growth rate in the same chamber, while heterogrowth or multilayer growth is also possible. Thus, the method according to the present invention is applicable to industrial production.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An epitaxial wafer comprising:
    a substrate of a compound semiconductor selected from the group consisting of GaAs, GaP, InAs, InP, AlGaAs and GaAsP;
    a buffer layer consisting essentially of GaN having a thickness in the range of 10 nm to 80 nm formed on said substrate as a heat resistant coating;
    an epitaxial layer consisting essentially of GaN formed on said buffer layer; and
    an incommensurate surface positioned between said buffer layer and said epitaxial layer to form an interface between said buffer layer and said epitaxial layer.

2. The epitaxial wafer in accordance with claim 1, wherein the thickness of said buffer layer is in the range of 20 nm to 60 nm.

* * * * *